(12) United States Patent
Tzu et al.

(10) Patent No.: US 6,630,408 B1
(45) Date of Patent: Oct. 7, 2003

(54) SELF ALIGNMENT PROCESS TO FABRICATE ATTENUATED SHIFTING MASK WITH CHROME BORDER

(75) Inventors: San-De Tzu, Taipei (TW); Ching-Chia Lin, Keelung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 68 days.

(21) Appl. No.: 09/944,910

(22) Filed: Sep. 4, 2001

(51) Int. Cl.⁷ .................. H01L 21/302; H01L 21/461
(52) U.S. Cl. ............... 438/717; 438/942; 438/945; 438/669
(58) Field of Search ................. 438/942, 945, 438/947, 950, 717, 669; 430/5, 322, 324

(56) References Cited

U.S. PATENT DOCUMENTS

| | | | |
|---|---|---|---|
| 5,641,592 A | * 6/1997 | Kim | 430/5 |
| 5,783,337 A | 7/1998 | Tzu et al. | 430/5 |
| 5,897,979 A | 4/1999 | Tzu et al. | 430/5 |
| 5,935,736 A | 8/1999 | Tzu | 430/5 |
| 6,001,512 A | 12/1999 | Tzu et al. | 430/5 |
| 6,007,324 A | 12/1999 | Tzu et al. | 431/5 |
| 6,022,644 A | 2/2000 | Lin et al. | 430/5 |

* cited by examiner

*Primary Examiner*—Caridad Everhart
(74) *Attorney, Agent, or Firm*—George O. Saile; Stephen B. Ackerman

(57) ABSTRACT

A new method is provided for the creation of an attenuated phase shifting mask. A transparent mask substrate is provided, a layer of attenuating phase shifting material is deposited on the surface of said transparent mask substrate, a layer of opaque material is deposited on the surface of said layer of attenuating phase shifting material. A layer of photoresist is deposited over the surface of the layer of opaque material. The photoresist is exposed by E-beam, creating a mask pattern and a guard ring pattern in the photoresist. The (E-beam) exposed photoresist is removed, the pattern created in the layer of photoresist is used to etch a mask pattern in the layer of opaque material and the layer of attenuating phase shifting material. The remaining photoresist is exposed to UV radiation in the region of the mask pattern and partially in the region of the guard ring. The (UV) exposed photoresist is removed, the remaining photoresist is reduced in height after which the openings of the mask pattern in the opaque layer are increased in size, the outside edge of the guard ring accurately defines the boundary of the device. The remaining photoresist is removed from the layer of opaque material.

10 Claims, 10 Drawing Sheets

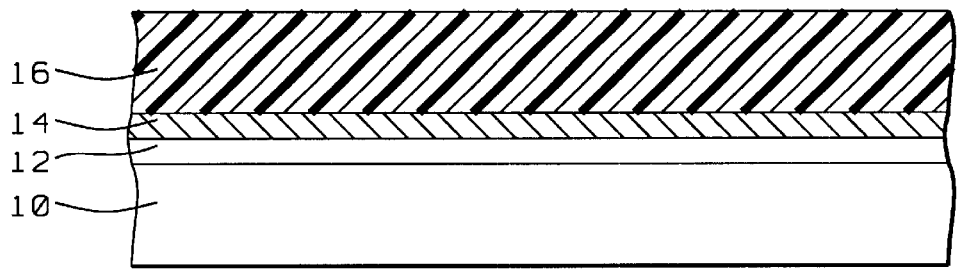
FIG. 1 — Prior Art
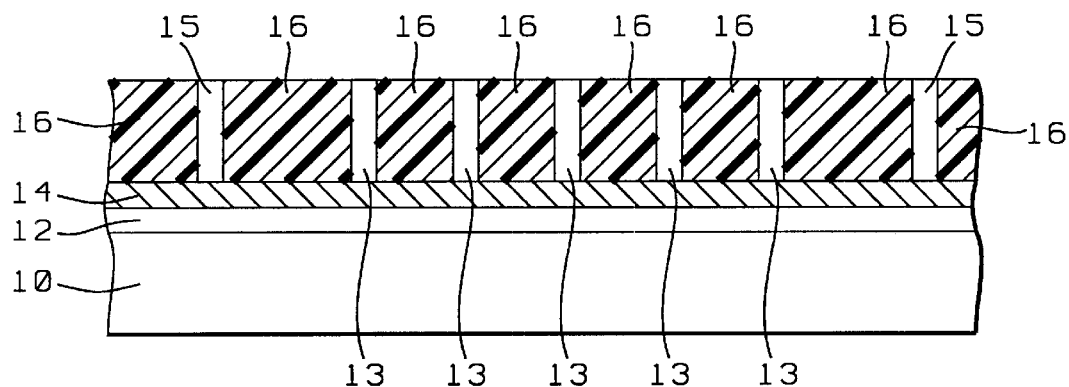
FIG. 2 — Prior Art
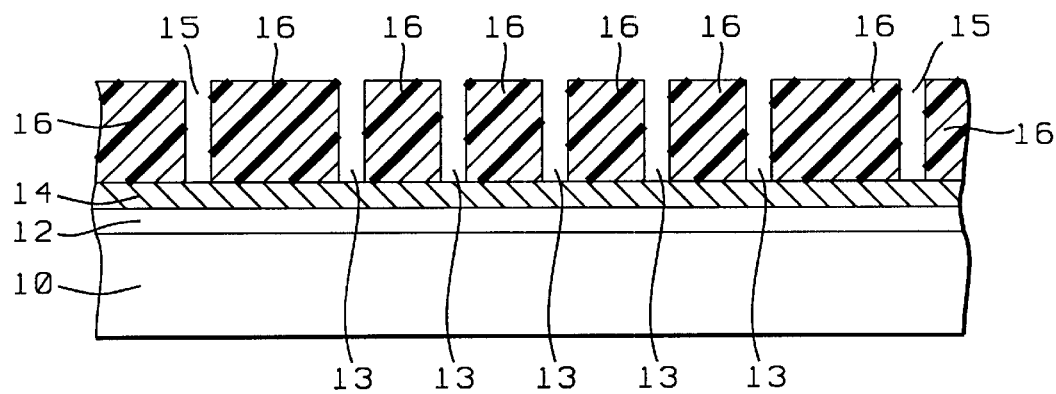
FIG. 3 — Prior Art

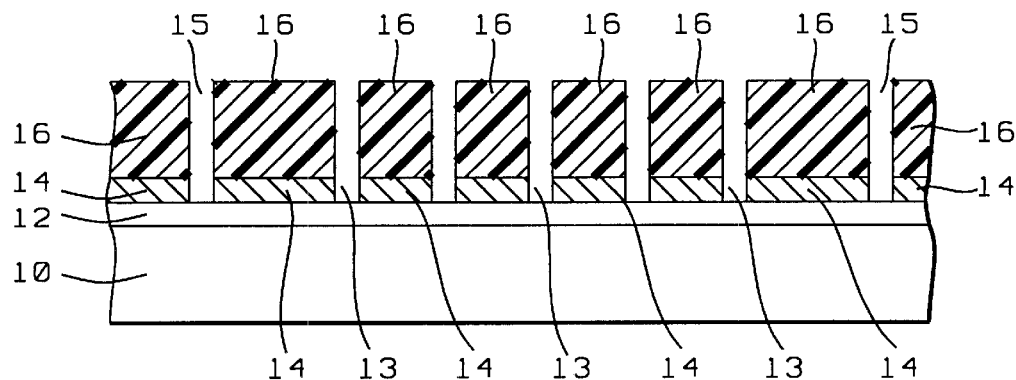
FIG. 4 - Prior Art
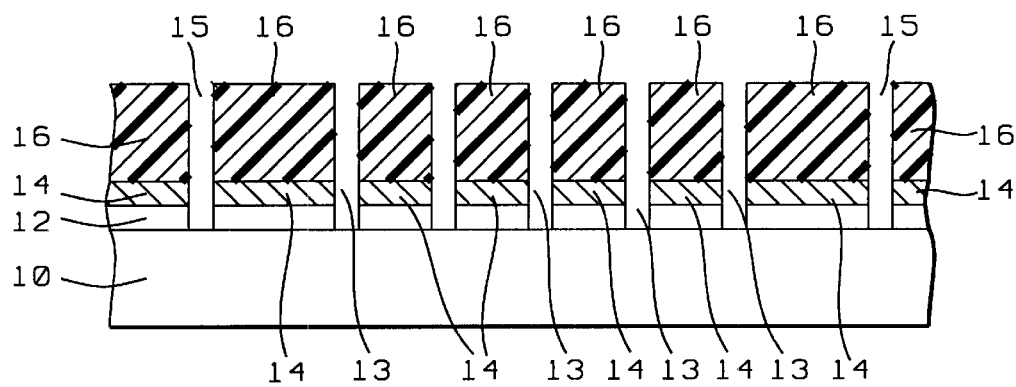
FIG. 5 - Prior Art
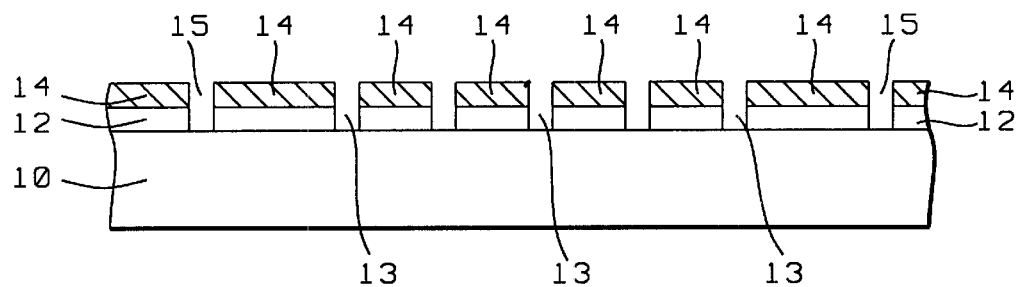
FIG. 6 - Prior Art

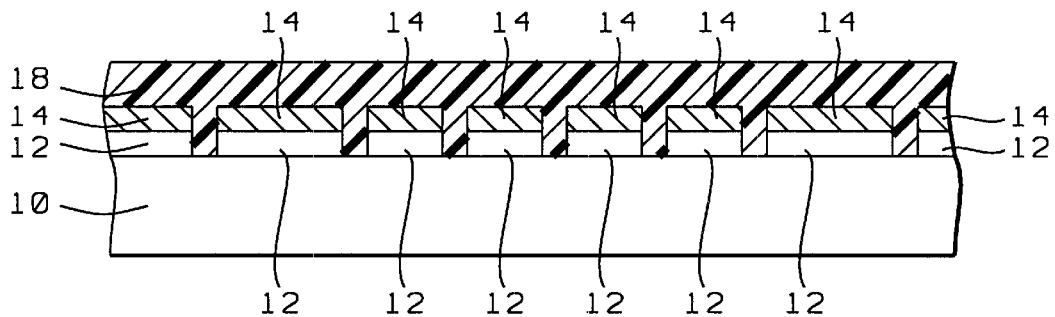
FIG. 7 - Prior Art
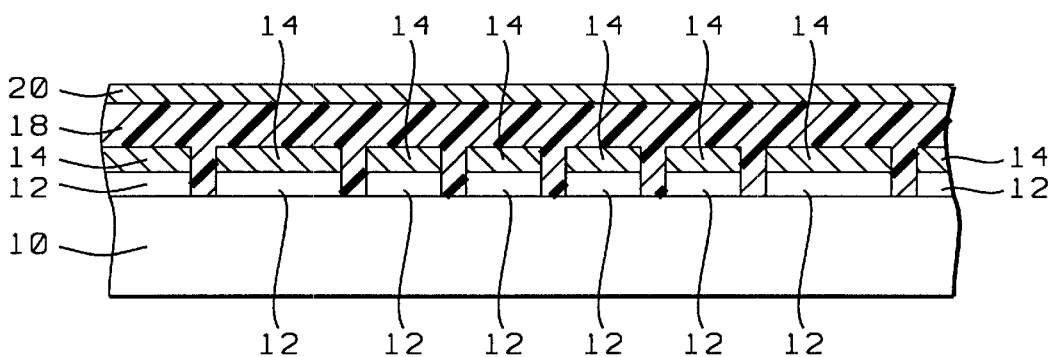
FIG. 8 - Prior Art
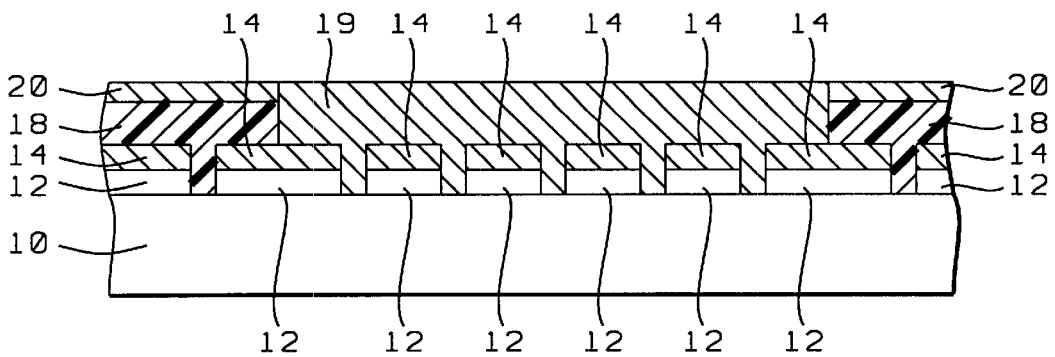
FIG. 9 - Prior Art

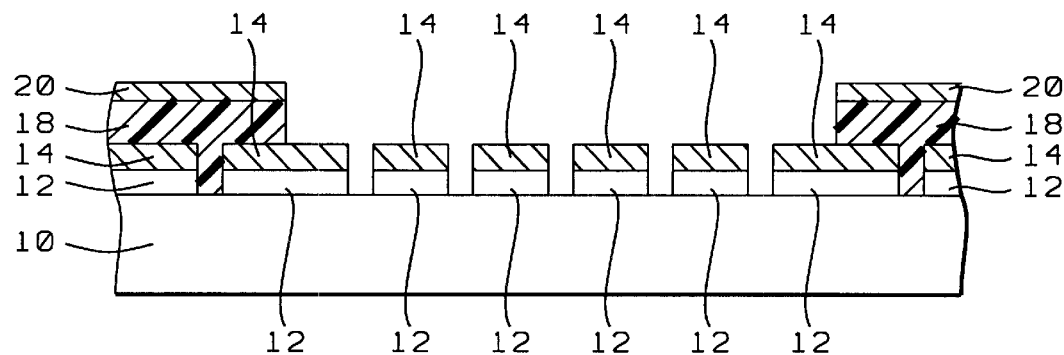
FIG. 10 - Prior Art
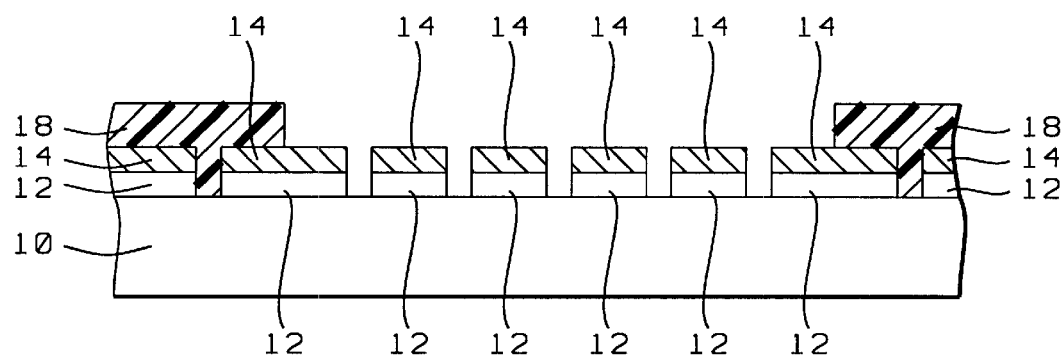
FIG. 11 - Prior Art
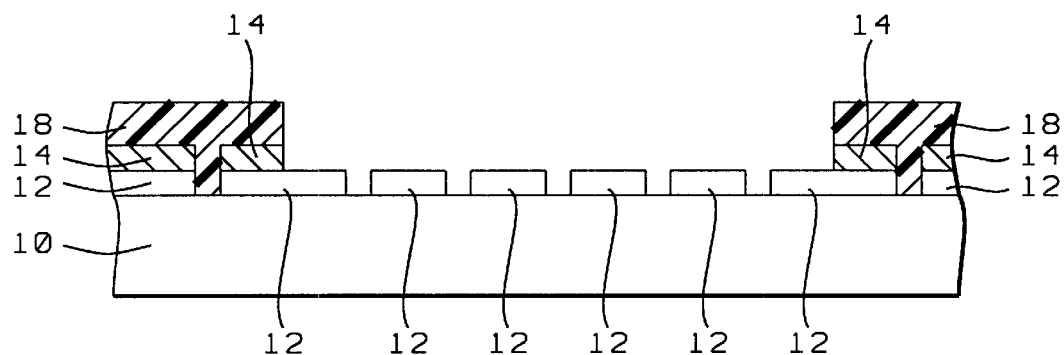
FIG. 12 - Prior Art

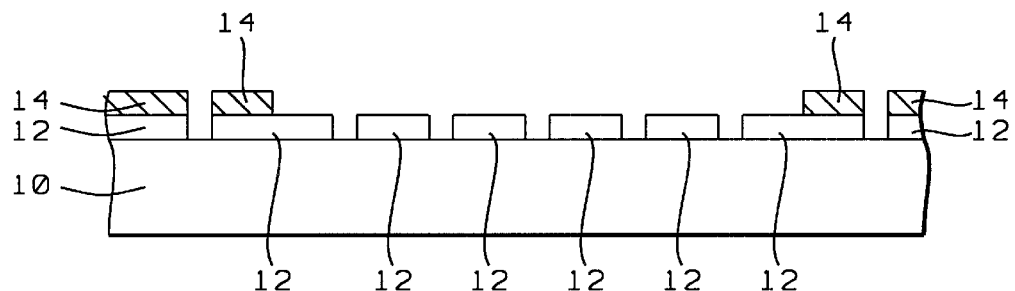
FIG. 13 – Prior Art
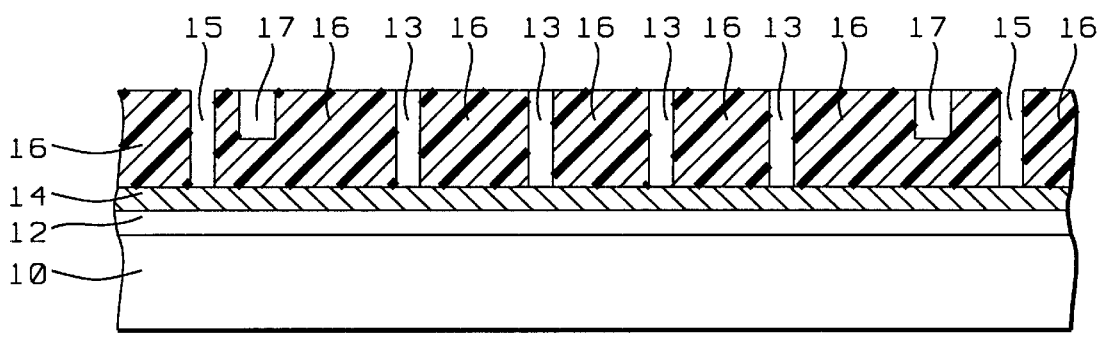
FIG. 14a
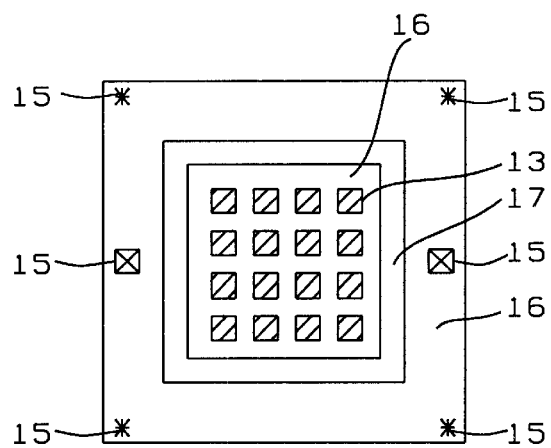
FIG. 14b

SELF ALIGNMENT PROCESS TO FABRICATE ATTENUATED SHIFTING MASK WITH CHROME BORDER

BACKGROUND OF THE INVENTION (1) Field of the Invention

The invention relates to the fabrication of integrated circuit devices, and more particularly, to a method for the creation of a cost-reduced phase shifting mask whereby further alignment problems that are typically experienced in creating a phase shifting mask are eliminated.

(2) Description of the Prior Art

The manufacturing of semiconductor devices requires the application of multiple diverse technical disciplines that collectively enable the continuing advancement of device performance that has been accomplished since the initiation of the semiconductor device. These various disciplines address various aspects of semiconductor device creation whereby. typically a plurality of active circuits is simultaneously created in a semiconductor substrate. To create a collection of circuits, commonly referred to as Integrated Circuit (IC) devices, the individual circuits are interconnected with metal leads. To further increase device density, multiple layers of interconnect metal can be created. These multiple layers of interconnect metal are separated by layers of dielectric or by insulating layers. Adjacent overlying layers of metal lines are interconnected by means of metal contact plugs or vias.

The semiconductor industry has, over the last several decades, been driven by a continued striving to improve device performance, which requires a continued decrease of semiconductor device feature size. In present day semiconductor devices, it is not uncommon to encounter feature size in the deep sub-micron range. With this decrease in device feature size, sub-micron metal interconnects become increasingly more important. A number of different approaches are used in the art for the formation of patterns of interconnect lines, most of these approaches start with the deposition of a patterned layer of dielectric, the pattern in the dielectric forms contact openings between overlying metal and underlying points of electrical contact. A layer of metal is deposited over the layer of dielectric and patterned in accordance with the required pattern of interconnect lines whereby the interconnect lines, where required, align with the underlying contact openings. The patterning of the layer of metal requires the deposition of a layer of photoresist over the layer of metal, the photoresist is exposed typically using photolithographic techniques and etched, typically using a dry etch process. The patterned layer of photoresist is removed after the interconnect metal line pattern has been created, leaving the interconnect line pattern in place. For sub-micron metal line sizes, these highlighted processing steps encounter a number of problems that are typical of device sub-miniaturization. These problems are problems of poor step coverage of the deposited metal (the metal should be evenly deposited and should fill the profile for the metal line with equal metal density), problems of etching (using dry etching, but metal such as copper and gold are difficult to plasma etch) and problems of step coverage and planarization for the overlying layer of dielectric.

Increased semiconductor device density frequently uses multi-level interconnections, the levels being separated by a layer of dielectric. Electrical contact between adjacent interconnect levels is established by creating vias or contact holes between these levels. It is clear that the contact holes must provide a dependable and low resistivity interconnect between adjacent levels of conducting lines. The reliability of the electrical connection that is established by means of a via or a contact hole must further not have any negative impact on device yield and performance.

Contact holes are typically formed in arrays of openings, the cross section of the contact holes can be a circle or a square or rectangular shape. Additional problems of creating uniform contact holes arise for application where the density of the array of contact holes varies over a relatively large surface area while these contact holes of various densities must be simultaneously created. These problems are further emphasized for sub-micron applications of 0.25 $\mu$m or less size contact holes. For these applications, the Attenuated Phase Shifting Mask (APSM) has found wide application whereby the APSM is applied using Deep Ultra Violet (DUV) light exposure. The phase shifting mask has shown promise and is increasingly used for applications where, due to small feature size or sharp variations in the density of the features that must be created, problems of Depth Of Field (DOF) are encountered. Increased semiconductor manufacturing requirements have also been met by increasing the size of the semiconductor substrate on the surface of which the semiconductor devices are created. This increase in size of the substrate brings with it problems of control of the Critical Dimensions (CD's) of created features over a relatively large surface area. The control of the CD at the edge of this large area has an impact on the control of the CD at the center of the large area. These impacts that are caused by variations in contact hole densities and by the use of relatively large surface areas into which contact holes must be created as yet pose a challenge for applications where APSM and DUV lithography are used.

The phase shifting mask makes possible the separation of images that are projected close to each other (cancellation of the proximity effect). For masks where no phase shifting is applied, the electrical field that is present at each of the apertures of the mask has the same phase at every aperture. Because of this and further emphasized by the diffraction and the limited resolution of the optical system that is used for the mask application, the diffracted waves of adjacent apertures will mutually enhance the field strength, causing a loss of CD of the adjacent features that are created by this conventional (no phase shifting) mask approach. By alternatingly applying a phase shifter (as part of the mask) between adjacent openings of the mask, the sign of the field of adjacent openings is reversed by the phase shifter. This eliminates the enhancement of the electric field of adjacent openings of the conventional mask, resulting in increased definition or control of the CD of the images that are created by the phase shifting mask.

Attenuating phase shifting masks are frequently used for the manufacturing of integrated circuit features, this especially for processing steps that have requirements of extremely closed alignment tolerances, that is in the submicron dimensional range.

Typical methods for the fabrication of phase shifting masks start with the surface of a semiconductor substrate over which a layer of chrome has been deposited. The layer of chrome is patterned with a layer of photoresist whereby the openings that have been created in the patterned layer of photoresist align with the openings that must be created in the deposited layer of chrome. The chrome is etched (removed from the surface of the substrate), after this the silicon surface of the substrate is etched creating the pattern of the phase shifting mask in the surface of the substrate. The photoresist and the chrome are removed, the mask that has been created in the surface of the substrate can be separated from the substrate by sawing.

Variations of this process can be made by using gray-tone masks that can be used to created gradated, three dimensional shapes in the surface of a substrate. A gray tone mask has regions that pass incident light in various degrees, allowing for etching the surface of the substrate to various depth and creating the three dimensional shapes. These three dimensional shapes can among others be used for the creation of vias.

A number of applications and patents have recently been made available that address attenuating phase shifting masks.

U.S. Pat. No. 5,897,979 (Tzu et al.) shows a process for an attenuating phase shifting mask.

U.S. Pat. No. 5,935,736 (Tzu) shows a process for an attenuating phase shifting mask that removes sidelobes.

U.S. Pat. No. 6,007,324 (Tzu et al.), U.S. Pat. No. 6,001,512 (Tzu et al.), U.S. Pat. No. 6,022,644 (Lin et al.) and U.S. Pat. No. 5,783,337 (Tzu et al.) show related mask processes.

SUMMARY OF THE INVENTION

A principle objective of the invention is to provide a method of creating an attenuated phase shifting mask that reduces negative impact of alignment accuracy during the mask creation process.

Another objective of the invention is to eliminate problems of alignment between E-beam exposure and a subsequently required UV exposure.

Yet another objective of the invention is to provide a cost reduced method of creating an attenuated phase shifting mask by saving on the photoresist coating and on the conventionally required double E-beam or laser beam exposures.

In accordance with the objectives of the invention a new method is provided for the creation of an attenuated phase shifting mask. A transparent mask substrate is provided, a layer of attenuating phase shifting material is deposited on the surface of the transparent mask substrate, a layer of opaque material is deposited on the surface of the layer of attenuating phase shifting material. A layer of photoresist is deposited over the surface of the layer of opaque material. The photoresist is exposed by E-beam, creating a mask pattern and a guard ring pattern in the photoresist. The (E-beam) exposed photoresist is removed, the pattern created in the layer of photoresist is used to etch a mask pattern in the layer of opaque material and the layer of attenuating phase shifting material. The remaining photoresist is exposed to UV radiation in the region of the mask pattern and partially in the region of the guard ring. The (UV) exposed photoresist is removed, the remaining photoresist is reduced in height after which the openings of the mask pattern in the opaque layer are increased in size, the outside edge of the guard ring accurately defines the boundary of the device. The remaining photoresist is removed from the layer of opaque material.

BRIEF DESCRIPTION OF THE DRAWINGS

FIGS. 1 through 13 show the conventional method that is used for the creation of an attenuated phase shifting mask, as follows:

FIG. 1 shows a cross section of a quartz layer over which a layer of shifter, chrome and photoresist have been deposited, FIG. 2 shows the E-beam exposure that is applied to the cross section of FIG. 1, FIG. 3 shows the cross section after development of the exposed layer of photoresist, at this time the surface is subjected to a bake, FIG. 4 shows after the layer of chrome has been wet etched, FIG. 5 shows a cross section after the shifter layer has been dry etched, FIG. 6 shows a cross section after the layer of photoresist has been removed, FIG. 7 shows a cross section after a blanket deposition of a layer of photoresist, FIG. 8 shows a cross section after a conductive layer has been deposited over the layer of photoresist, FIG. 9 shows a cross section after E-beam exposure, FIG. 10 shows a cross section after development of the conductive layer and the layer of photoresist, FIG. 11 shows a cross section after the removal of the patterned conductive layer, the surface is subjected to a bake at this time, FIG. 12 shows a cross section after the layer of chrome has been wet etched, and FIG. 13 shows a cross section after the layer of photoresist has been removed from the surface.

FIGS. 14a and 14b through 21 show the invention, as follows:

FIG. 14a shows a cross section of a quartz surface over which a layer of shifter, a layer of chrome and a layer of photoresist have been deposited; these layers are exposed by E-beam radiation, FIG. 14b shows a top view of the cross section of FIG. 14a, FIG. 15 shows a cross section after the exposed layer of photoresist has been developed, FIG. 16 shows a cross section after the layer of chrome and the layer of shifter have been etched, FIG. 17 shows a cross section during UV radiation of the surface of the layer of patterned photoresist, FIG. 18 shows a cross section after UV exposure of the layer of photoresist, FIG. 19 shows a cross section after the patterned layer of photoresist has been partially removed by $O_2$ plasma etching, FIG. 20 shows a cross section after the chrome layer has been etched using a wet etch, all of the layer of chrome within the UV radiation area has been removed, and FIG. 21 shows a cross section after the patterned layer of photoresist has been removed.

FIG. 22a shows a top view during UV and E-beam exposures of the photoresist,

FIG. 22b shows a cross section exposed surface of FIG. 22a.

DESCRIPTION OF THE PREFERRED EMBODIMENTS

Figure 15:
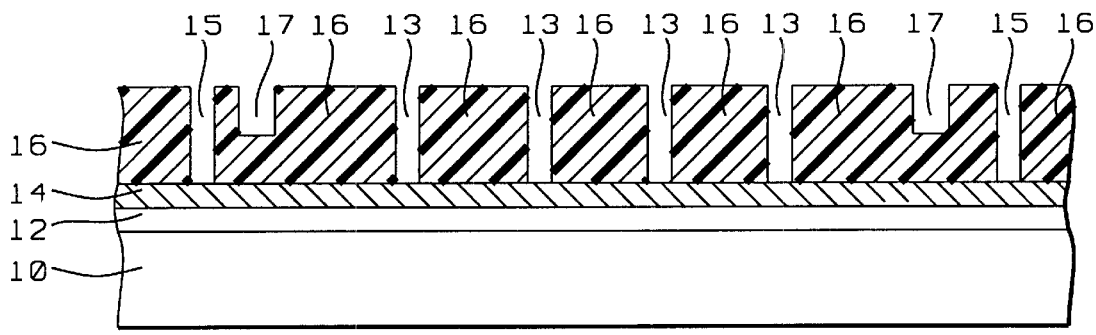
Figure 16:
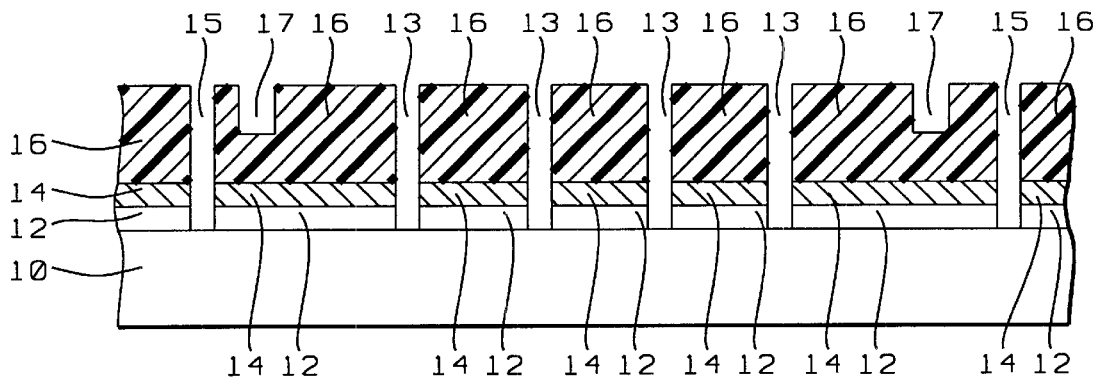

The method that has typically been used for the creation of the attenuating phase shifting mask will first be briefly highlighted.

As previously pointed out, an attenuating phase shifting mask comprises a layer of shifter material that is deposited over the surface of a mask substrate. The shifter layer affects the phase shifting of the attenuating phase shifting mask, this phase shifting must be made as independent of the incident light wavelength as possible, this so that the mask can be aligned for different applications that use different frequencies of incident light.

Typically, phase shifting materials that are used for attenuating phase shifting mask have a light transmittance of about 8% for incident light with a wavelength of 365 nanometers. This light transmittance however is about 30% for incident light with a light wavelength in excess of 600 nm.

Because of this difference in light transmittance and the dependency of the light transmittance to the incident light wavelength, it is difficult to align the attenuating phase shifting mask by photolithography tools like the wafer stepper or scanner. For this reason most attenuating phase shifting masks are provided with a layer of chrome that is deposited over the layer of shifter material, thus providing a double layered attenuating phase shifting mask.

FIGS. 1 through 13 provide an overview of the processing sequence that is used for the creation of such a double layered attenuating phase shifting mask.

FIG. 1 shows a cross section of a mask substrate 10, over which a layer 12 of attenuating phase shifting material has been deposited, a layer 14 of chrome has been deposited over the layer 12 of phase shifting material. Layer 16 of photoresist has been deposited over the layer 14 of chrome. As a material that can be used for layer 12 of phase shifting material can be cited MoSiON.

FIG. 2 shows the E-beam exposure of the layer 16 of photoresist, creating an exposure pattern 13 and alignment marks 15 in the layer 16 of photoresist.

The layer 16 of photoresist is next eveloped, FIG. 3, including the alignment marks 15. The pattern 13/15 is then transferred to the layer 14 of chrome by means of wet etching as shown in FIG. 4. Any particles that may have been left on the surface as a result of the wet etching of the layer 14 of chrome are then removed. To avoid affecting or damaging the patterned photoresist layer 16 during this cleaning process, a chemically neutral cleaning agent such as deionized water is used for the cleaning process.

The pattern 13/15 that is shown in FIG. 4 in the layers 16 of photoresist and 14 of chrome is next transferred to the layer 12 of phase shifting material. by means of a anisotropic (vertical) dry etching of the phase shifting layer 12, see FIG. 5. During this process of dry etching the layer 12 of phase shifting material, the layer 16 of photoresist is fully exposed to this dry etch but must not be affected by this dry etch. Patterned first layer 16 of photoresist is removed from the surface, FIG. 6 and a new layer 18 of second photoresist is deposited, see FIG. 7.

A layer 20, FIG. 8, of conductive material is deposited over the surface of the second layer 18 of photoresist, this layer prevents electron charge to occur during E-beam exposure. FIG. 9 shows how the layer 20 of conductive material and the second layer 18 of photoresist are patterned by E-beam or laser beam exposure 19 for a mask border pattern in the layer 14 of chrome. The second photoresist 18 is removed from the surface in accordance with the exposure pattern 19, FIG. 10, the conductive layer 20 is stripped, FIG. 11, the exposed chrome 14 is removed from above the phase shifting layer 12 by wet etching, FIG. 12. The same considerations apply to this step of wet etching the chrome as previously have been indicated with respect to the first layer 16 of photoresist, that is the wet etch of the chrome must not affect the layer 18 of second photoresist. As a final step, the patterned layer 18 of second photoresist is removed from the surface, FIG. 13.

A detailed description of the invention will now be provided by referring to FIG. 1 and to FIGS. 14a and 14b through 21.

FIG. 1 shows a transparent mask substrate 10 that typically is formed of a material such as quartz and to a thickness of about 0.25 inches. A layer 12 of attenuating phase shifting material, such as MoSiON having a thickness of between about 80 and 120 nanometers or CrON having a thickness of between 100 and 140 nanometers is deposited over the surface of the transparent substrate 10. The layer 12 of attenuating phase shifting material has a light transmittance of between about 6% and 10% for light having a wavelength of 365 or 248 or 193 nanometers. A layer 14 of opaque material, such as chrome, has been deposited over layer 12 of phase shifting material to a thickness of between about 80 and 120 nanometers. A layer 16 of photoresist has been deposited over the layer 14 of opaque material. It must be observed at this time that the layer 16 of first photoresist will, under subsequent processing, be exposed only to dry etching and will not (as opposed to conventional methods) be exposed to wet etching. This allows for a greater latitude in the selection of the material that is used for the first layer of photoresist and will permit for the selection of a photoresist material that has higher sensitivity to photolithographic exposure and subsequent etching.

Next, as shown in FIG. 14a, a pattern is exposed in the layer 16 of photoresist, this pattern includes an original mask pattern 13 and an additional guard ring pattern 17 that is created around the device boundary (the outside edge of the guard ring is applied to define the device boundary). It will be noted in FIG. 14a that the original mask pattern 13 penetrates the layer 16 of photoresist while the additional guard ring pattern 17 only partially penetrates the layer 16 of photoresist. This difference in penetration of the two patterns is accomplished by two different E-beam exposures, that is a first exposure using a normal dosage of exposure for the original mask pattern 13 and a second exposure with a lower dosage of exposure for the additional guard ring pattern 17. The first and second E-beam exposures together are part of one E-beam exposure frame. FIG. 14a highlights the difference in penetration of the two exposures for the original mask pattern 13 and an additional guard ring pattern 17. FIG. 14b is a top view of the two exposures, which shows that the guard ring pattern 17 surrounds the boundaries of mask 13. The device boundaries have not been highlighted in FIG. 14b but can approximately be configured as containing all of the original mask pattern 13 that is shown in FIG. 14a.

Figure 17:
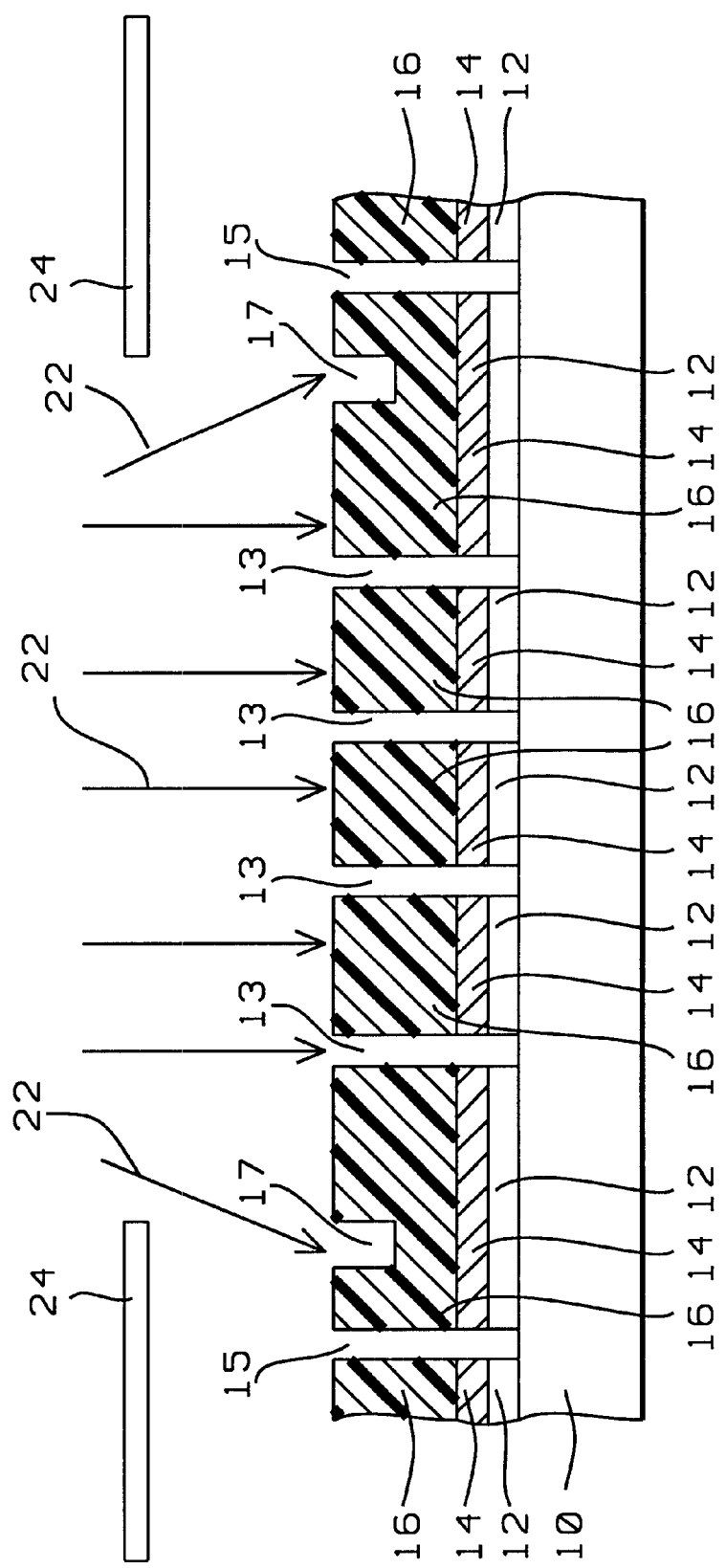
Figure 18:
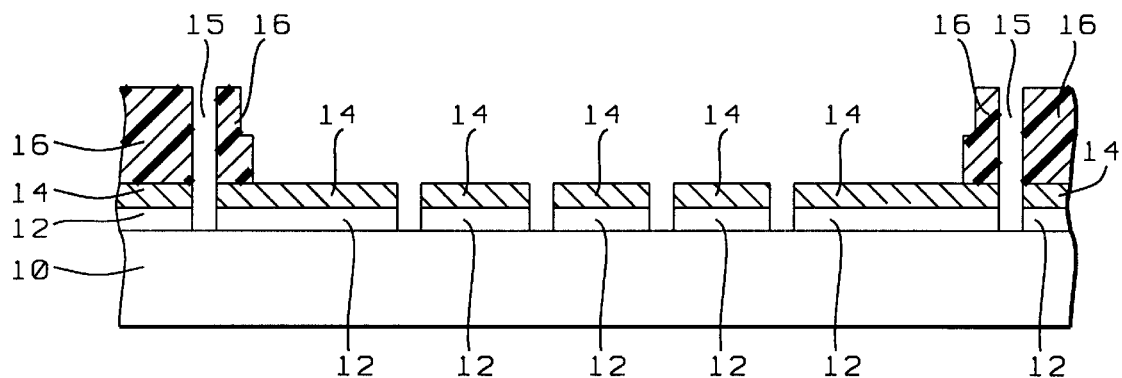

The following processing step removes the patterned layer 16 of photoresist from within the region that is bounded by the guard ring pattern 17, as shown in FIGS. 17 and 18. FIG. 17 shows the exposure 22 by UV light of the surface of layer 16, this exposure is a selective exposure whereby only the surface region of layer 16 that is bounded by the guard ring pattern 17 is exposed. Mask (or blades) 24 is used to achieve the selectivity of exposure 22, mask 24 may be comprise four plates. The exposure 22 changes the composition of the layer 16 in the regions where the photoresist is exposed, preparing this exposed photoresist for easy removal from the surface, as shown in FIG. 18, after which the surface of the patterned layer 14 of chrome is cleaned thoroughly.

The following processing step removes the patterned layer 16 of photoresist from within the region that is bounded by the guard ring pattern 17, as shown in FIGS. 17 and 18. FIG. 17 shows the exposure 22 by. UV light of the surface of layer 16, this exposure is a selective exposure whereby only the surface region of layer 16 that is bounded by the guard ring pattern 17 is exposed. Mask (or blades) 24 is used to achieve the selectivity of exposure 22, mask 24 may be comprise four plates. The exposure 22 changes the composition of the layer 16 in the regions where the photoresist is exposed, preparing this exposed photoresist for easy removal from the surface, as shown in FIG. 18, after which the surface of the patterned layer 14 of chrome is cleaned thoroughly. The removal of the exposed photoresist, as shown in FIG. 18 after the exposed photoresist has been removed by develop.

Figure 19:
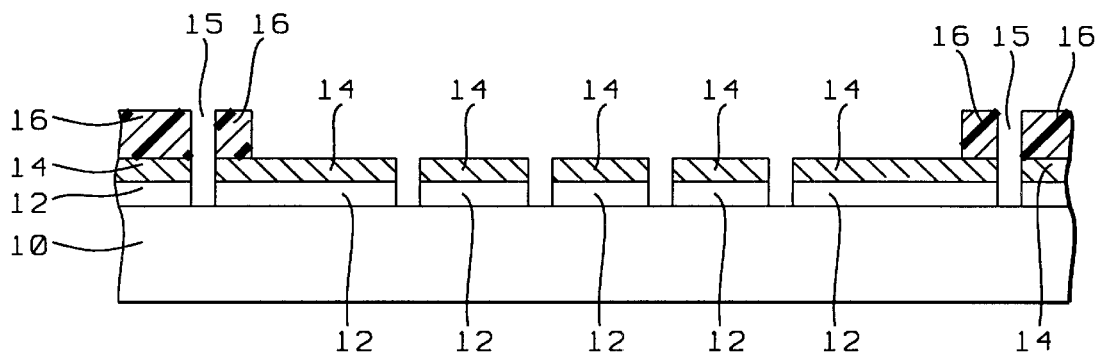

A controlled $O_2$ plasma etch is then performed to the surface of the remaining patterned layer 16 of photoresist, this remaining pattern is shown in FIG. 18. This $O_2$ plasma etch removes only the upper layer of layer 16 of photoresist, leaving in place portions of the photoresist over the surface of layer 14 of chrome. FIG. 19 shows a cross section after this $O_2$ plasma etch has been completed, resulting in a layer of photoresist of reduced height that remains in place over the layer 14 of chrome.

Figure 20:
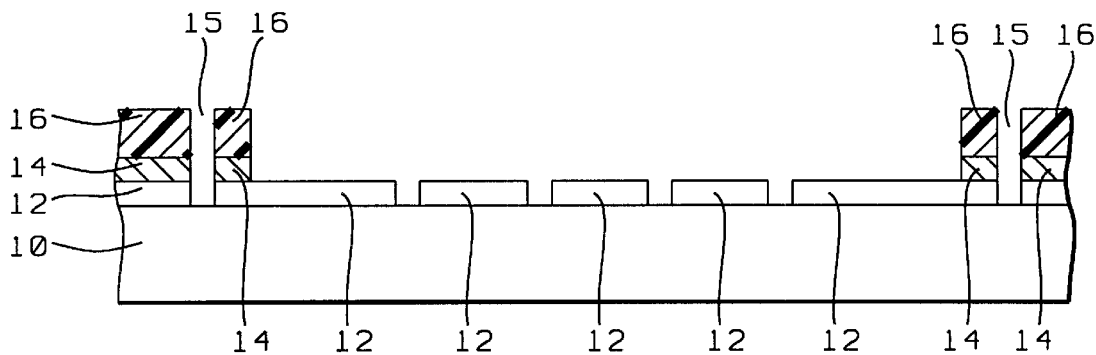
Figure 21:
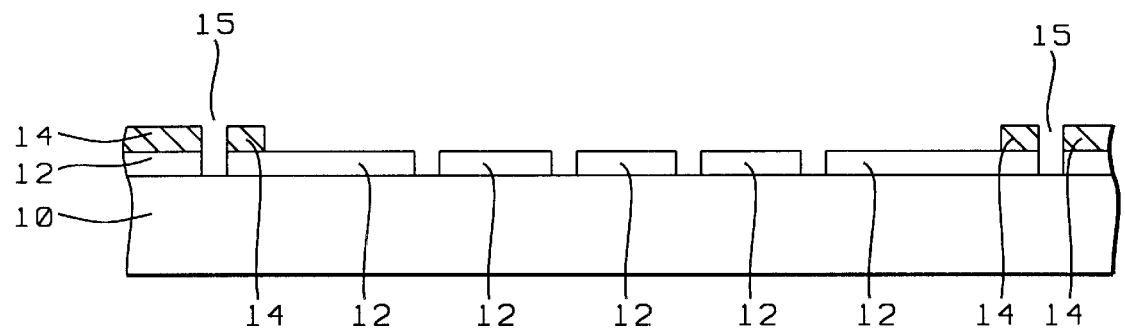

The chrome 14 that overlays the phase shifting material 12 must be removed as shown in cross section in FIG. 20. This chrome removal is a wet etching process. As a final processing step of the invention, FIG. 21, the remainder 16 of the photoresist is removed from the layers 14 of chrome, creating the attenuated phase shifting mask of the invention that is shown in cross section in FIG. 21.

The invention can be summarized as follows:

the invention starts with a quartz surface over which in succession layers of attenuating phase shifting material, chrome and photoresist have been deposited the surface of the layer of photoresist is exposed by E-beam, creating a mask pattern and a surrounding guard ring pattern; the E-beam exposure for the mask pattern penetrates the layer of photoresist, the exposure for the guard ring pattern partially penetrates the layer of photoresist the exposed photoresist is removed, creating a patterned layer of photoresist, the photoresist removal penetrating the layer of photoresist in accordance with the mask pattern (partially exposing the surface of the layer of chrome in a first pattern) and partially penetrating the layer of photoresist in accordance with the guard ring pattern the layers of chrome and shifter material are etched in accordance with the first pattern, the guard ring pattern is unaffected by this etch the patterned layer of photoresist is selectively exposed to UV light, this exposure exposes the patterned photoresist within the boundaries of the mask pattern and partially exposes the guard ring pattern on the side of the guard ring pattern that is closest to and surrounds the mask pattern the UV exposed photoresist is removed down to the surface of the layer of chrome, leaving the unexposed photoresist in place surrounding the guard ring pattern; the surface of the first pattern of chrome is exposed by this photoresist removal an $O_2$ plasma removes a thickness of the photoresist that surrounds the guard ring pattern a chrome wet etch patterns the exposed first pattern of chrome into a second pattern; the remaining pattern of chrome overlies and is centered with respect to the underlying pattern of phase shifting material, and the remaining layer of photoresist surrounding the guard ring is removed from above the patterned layer of chrome.

The invention as highlighted above offers that advantages of:

low cost high throughput, and no need for mask alignments.

Figure 22A:
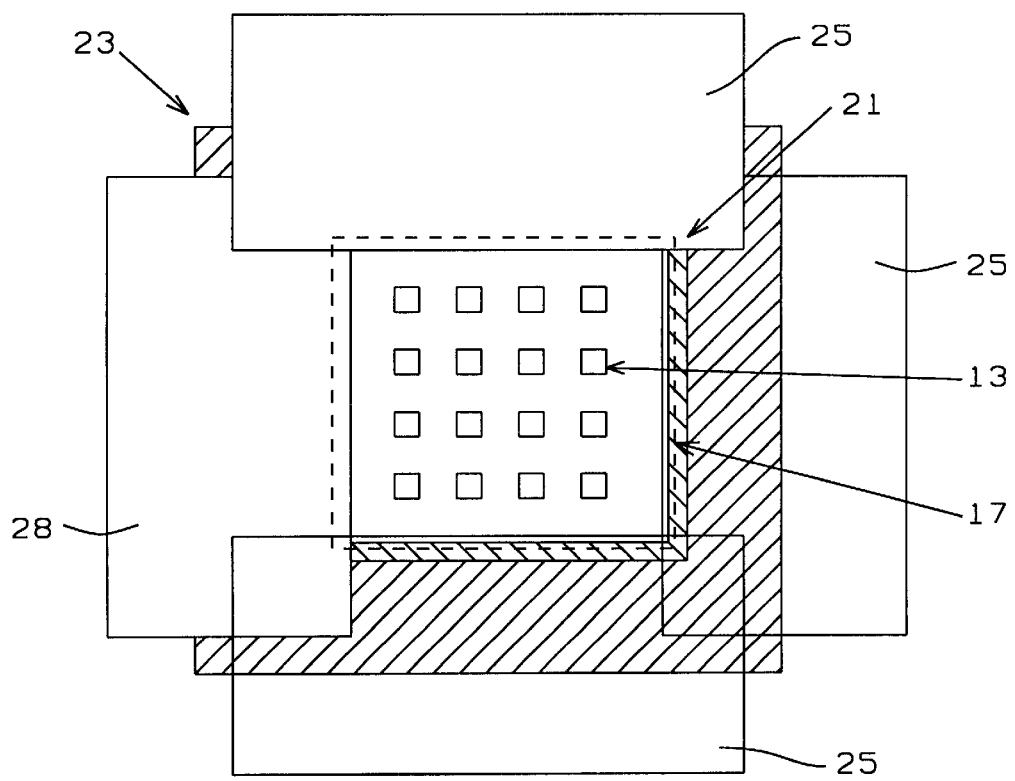
FIGS. 22a and 22b show exposures of the photoresist that is used the creation of a phase shifting mask, as follows.
Figure 22B:
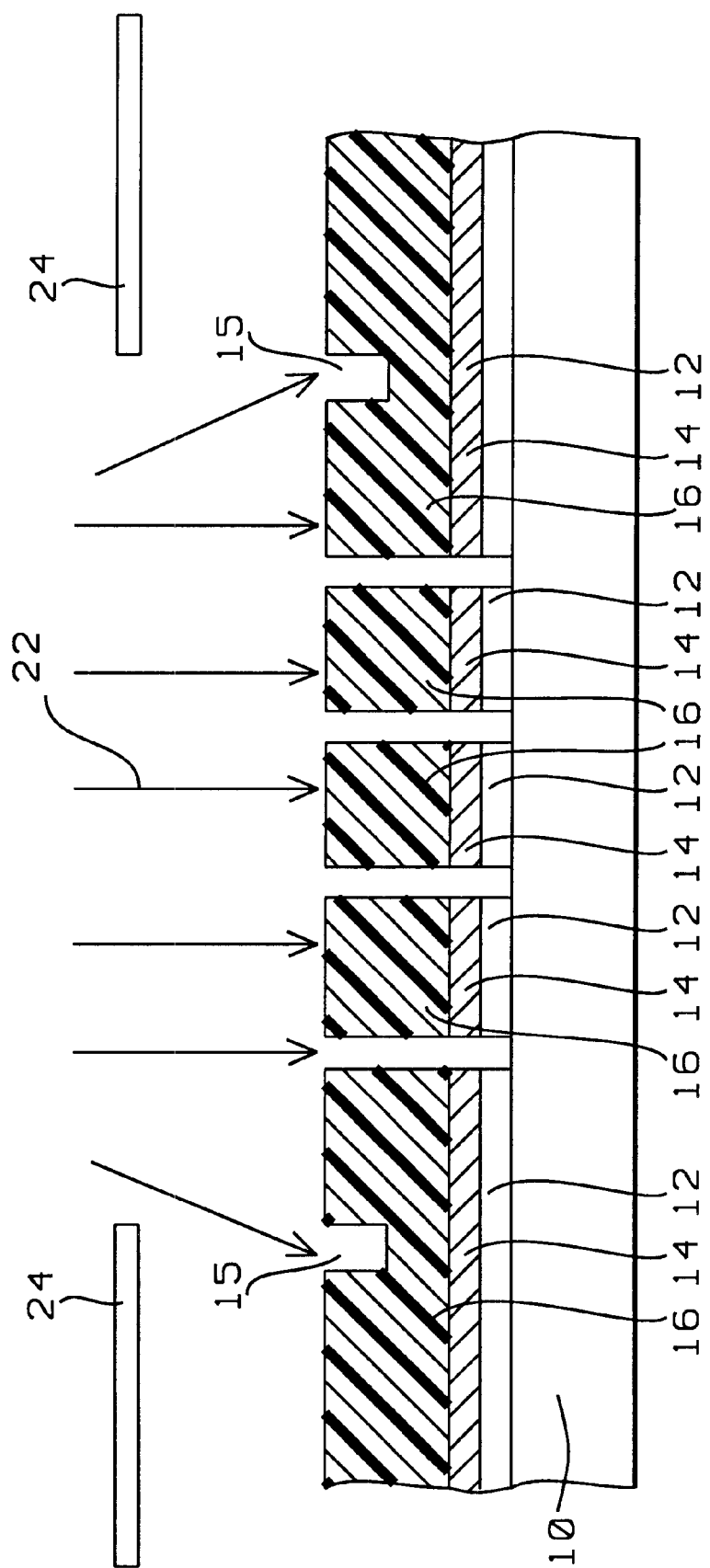

FIG. 22a shows a top view of how the exposure of the layer 16 of photoresist by UV light can be implemented, this as shown in FIG. 17 for the preparation of the partial removal of the layer 16 of photoresist. Surfaces 25 are surfaces that intercept the UV incident light which, in the top view that is shown in FIG. 22a, is directed into the surface of FIG. 22a. Regions 13 and 17 have been highlighted, these are the original mask pattern 13 and the guard ring pattern 17 that have previously been discussed. Of interest is the region under the guard ring pattern 17 where the incident UV light is deflected from a straight path by the shields or blades 25 and therefore impacts the surface of the layer of photoresist with diminished energy. This is what is required in order to create the cross section of the remaining layer of photoresist that is shown in FIG. 18. Around the edges of the opening created by the four shields 25, the photoresist is not as strongly affected by the incident UV light, an effect that quickly becomes more pronounced the further the deflected light is removed from the opening created by the four shields 25. FIG. 22b is a vertical cross section of the arrangement of FIG. 22a, FIG. 22b will be recognized as being identical to FIG. 17. Further highlighted in FIG. 22a is the surface of the mask 23.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming an attenuating phase shifting mask having a chrome border on a semiconductor substrate, comprising the steps of:

providing a attenuating phase shifting mask substrate having a primary surface;

forming a layer of attenuating phase shifting material on the primary surface of said attenuating phase shifting mask substrate;

forming a layer of opaque material on said layer of attenuating phase shifting material;

patterning said layer of opaque material by forming a resist pattern on the surface of said opaque material, said resist pattern comprising a first exposure creating a first resist pattern, said first resist pattern being a mask pattern and an alignment mark pattern, and a second, low energy exposure, creating a second resist pattern, said second resist pattern being a guard ring pattern, said guard ring pattern being interspersed between said mask pattern and said alignment mark pattern;

forming said first resist pattern in said layer of opaque material and in said layer of attenuating phase shifting material, using said first resist pattern in said pattern region of said layer of opaque material as a mask;

placing a radiation interceptor over said resist pattern, said radiation interceptor not covering said mask pattern, said radiation interceptor partially covering said guard ring pattern;

exposing said resist pattern through said radiation interceptor;

removing said exposed resist pattern, leaving an unexposed resist pattern having a thickness in place surrounding said guard ring pattern;

reducing said thickness of said resist pattern surrounding said guard ring pattern, creating a resist pattern of reduced and uniform thickness surrounding said guard ring pattern;

etching said layer of opaque material in accordance with said resist pattern of reduced and uniform thickness; and removing said resist pattern of reduced and uniform thickness surrounding said guard ring region.

2. The method of claim 1, said layer of attenuating phase shifting material comprising MoSiN having a thickness between about 80 and 120 nanometers.

3. The method of claim 1, said layer of attenuating phase shifting material comprising CrON having a thickness between about 100 and 140 nanometers.

4. The method of claim 1, said layer of opaque material comprising chrome having a thickness between about 80 and 120 nanometers.

5. The method of claim 1, said reducing said thickness of said resist pattern surrounding said guard ring region by a measurable amount comprises an oxide plasma etching.

6. The method of claim 1, said etching said layer of opaque material, partially removing said opaque material from the surface of said layer of shifting material comprising a chrome wet etching process.

7. A method of forming an attenuating phase shifting mask having a chrome border on a semiconductor substrate, comprising the steps of:

providing an alternating phase shifting mask substrate having a primary surface, a layer of attenuating phase shifting material having been deposited on the primary surface of said alternating phase shifting mask substrate, a layer of opaque material having been deposited on said layer of attenuating phase shifting material;

depositing a layer of photoresist over the surface of said layer of opaque material;

patterning said layer of photoresist creating a pattern in said layer of photoresist comprising a mask pattern and a alignment mark pattern, further comprising a guard ring pattern, said patterning of said layer of photoresist using a first E-beam exposure, said first E-beam exposure comprising a mask pattern and an alignment mark pattern, creating a mask pattern and an alignment mark pattern in said layer of photoresist, said E-beam exposure further comprising a low energy second E-beam exposure creating a guard ring pattern in said layer of photoresist, said guard ring pattern being interspersed between said mask pattern and said alignment mask pattern, said mask pattern and alignment mark pattern fully penetrating said layer of photoresist, said guard ring pattern partially penetrating said layer of photoresist;

etching said layer of opaque material and said layer of phase shifting material in accordance with said mask pattern and said alignment mark pattern;

placing blades over said patterned layer of photoresist, said blades not covering said mask pattern of said patterned layer of photoresist, said blades partially covering said guard ring pattern of said patterned layer of photoresist;

placing a source of ultra-violet radiation, positioning said source of ultra-violet radiation and said patterned layer of photoresist on opposite sides of said blades, said patterned layer of photoresist facing said source of ultra-violet radiation;

exposing said patterned layer of photoresist by energizing said source of ultra-violet radiation;

removing said exposed photoresist, leaving a remaining layer of photoresist in place overlying said layer of opaque material to a thickness in a region outside said guard ring pattern;

reducing said thickness of said remaining layer of photoresist by applying an oxide etch to said remaining layer of photoresist;

etching said layer of opaque material in accordance with said remaining layer of photoresist by applying a wet etch; and removing said remaining layer of photoresist.

8. The method of claim 7, said layer of attenuating phase shifting material comprising MoSiN having a thickness between about 80 and 120 nanometers.

9. The method of claim 7, said layer of attenuating phase shifting material comprising CrON having a thickness between about 100 and 140 nanometers.

10. The method of claim 7, said layer of opaque material comprising chrome having a thickness between about 80 and 120 nanometers.

* * * * *

UNITED STATES PATENT AND TRADEMARK OFFICE
CERTIFICATE OF CORRECTION

PATENT NO.    : 6,630,408 B1
DATED         : October 7, 2003
INVENTOR(S)   : San-De Tzu and Ching-Chia Lin It is certified that error appears in the above-identified patent and that said Letters Patent is hereby corrected as shown below:

Column 6,
Line 52, insert -- Fig. 15 shows how the exposed layer 16 of photoresist has been etched, removing the exposed photoresist from the surface of the layer 14 of chrome in a original mask pattern 13 while partially removing the exposed photoresist 16 in the guard ring pattern 17. A dry etch such as a Reactive Ion Etch is, Fig. 16, applied to the layer 14 of chrome and the underlying layer 12 of phase shifting material, this etch is in accordance with the original mask pattern 13 that has been created in the layer 16 of photoresist. The layers of chrome and phase shifter material are in this manner removed from above the surface of the transparent substrate 10 in accordance with the original mask pattern 13. The guard ring pattern 17 is not affected by this dry etch since this dry etch does not affect the photoresist of layer 16 --

Signed and Sealed this

Seventeenth Day of August, 2004

JON W. DUDAS
*Acting Director of the United States Patent and Trademark Office*